US009818911B2

United States Patent
Yamamoto et al.

(10) Patent No.: US 9,818,911 B2
(45) Date of Patent: *Nov. 14, 2017

(54) SEMICONDUCTOR LIGHT-EMITTING ELEMENT

(71) Applicant: Sharp Kabushiki Kaisha, Sakai (JP)

(72) Inventors: Hiroaki Yamamoto, Sakai (JP); Susumu Ohmi, Sakai (JP); Yufeng Weng, Sakai (JP); Kiminori Tanabe, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/253,330

(22) Filed: Aug. 31, 2016

(65) Prior Publication Data

US 2016/0372632 A1 Dec. 22, 2016

Related U.S. Application Data

(63) Continuation of application No. 14/653,813, filed as application No. PCT/JP2014/065322 on Jun. 10, 2014, now Pat. No. 9,466,763.

(30) Foreign Application Priority Data

Sep. 3, 2013 (JP) .................................. 2013-182039

(51) Int. Cl.
*H01L 33/22* (2010.01)
*H01L 33/32* (2010.01)
(Continued)

(52) U.S. Cl.
CPC .......... *H01L 33/22* (2013.01); *H01L 33/0095* (2013.01); *H01L 33/02* (2013.01);
(Continued)

(58) Field of Classification Search
None
See application file for complete search history.

(56) References Cited

U.S. PATENT DOCUMENTS 5,491,350 A 2/1996 Unno et al.
9,466,763 B2 * 10/2016 Yamamoto .............. H01L 33/02
(Continued)

FOREIGN PATENT DOCUMENTS

CN 102447023 5/2012
CN 102714152 10/2012
(Continued)

OTHER PUBLICATIONS

International Search Report dated Aug. 19, 2014, directed to PCT/JP2014/065322; 6 pages.
(Continued)

*Primary Examiner* — William Coleman
*Assistant Examiner* — Kien Ly
(74) *Attorney, Agent, or Firm* — Morrison & Foerster LLP

(57) ABSTRACT

A semiconductor light-emitting element includes a substrate and a semiconductor stack portion provided on the substrate and having at least a first-conductivity-type semiconductor layer, a light-emitting layer, and a second-conductivity-type semiconductor layer. The substrate has a property to allow transmission of light from the light-emitting layer, and has a hexahedral shape including a first surface on which a semiconductor stack portion is provided, a second surface located opposite to the first surface, a pair of third surfaces orthogonal to the first surface and the second surface, and a pair of fourth surfaces orthogonal to the first surface and the second surface and different from the pair of third surfaces.

12 Claims, 6 Drawing Sheets

(51) Int. Cl.
*H01L 33/42* (2010.01)
*H01L 33/16* (2010.01)
*H01L 33/12* (2010.01)
*H01L 33/00* (2010.01)
*H01L 33/02* (2010.01)

(52) U.S. Cl.
CPC .............. *H01L 33/12* (2013.01); *H01L 33/16* (2013.01); *H01L 33/325* (2013.01); *H01L 33/42* (2013.01); *H01L 2224/16245* (2013.01); *H01L 2224/48091* (2013.01); *H01L 2224/48247* (2013.01); *H01L 2224/48465* (2013.01)

(56) References Cited

U.S. PATENT DOCUMENTS

| | | | |
|---|---|---|---|
| 2007/0111481 A1* | 5/2007 | Tamura | B23K 26/0057 438/463 |
| 2010/0019251 A1* | 1/2010 | Lee | H01L 33/0095 257/79 |
| 2010/0140636 A1* | 6/2010 | Donofrio | H01L 33/46 257/98 |
| 2010/0140647 A1 | 6/2010 | Joung | |
| 2011/0312193 A1* | 12/2011 | Abe | H01L 33/0095 438/795 |
| 2012/0083063 A1 | 4/2012 | Shinoda et al. | |
| 2012/0267656 A1* | 10/2012 | Kuo | H01L 31/02363 257/98 |
| 2012/0292642 A1* | 11/2012 | Urata | H01L 29/045 257/77 |
| 2013/0015481 A1* | 1/2013 | Yoshimura | H01L 33/22 257/98 |
| 2013/0153947 A1* | 6/2013 | Lim | H01L 33/22 257/98 |
| 2014/0217423 A1 | 8/2014 | Fujita et al. | |
| 2014/0353679 A1 | 12/2014 | Seo et al. | |
| 2016/0013361 A1* | 1/2016 | Chiu | H01L 33/22 257/98 |

FOREIGN PATENT DOCUMENTS

| | | |
|---|---|---|
| JP | 2010-141331 | 6/2010 |
| JP | 2012-79720 | 4/2012 |
| JP | 2013-21250 | 1/2013 |
| JP | 2013-51260 | 3/2013 |
| WO | WO-2011/090024 | 7/2011 |

OTHER PUBLICATIONS

Yamamoto et al., U.S. Office Action dated Dec. 4, 2015, directed to U.S. Appl. No. 14/653,813, 11 pages.

* cited by examiner ance application of U.S.
SEMICONDUCTOR LIGHT-EMITTING ELEMENT

CROSS REFERENCE TO RELATED APPLICATIONS

This application is a continuation application of U.S. application Ser. No. 14/653,813, filed Jun. 18, 2015, which is a U.S. National Phase patent application of PCT/JP2014/065322, filed on Jun. 10, 2014, which claims priority to Japanese Application No. 2013-182039, filed on Sep. 3, 2013, each of which is hereby incorporated by reference in the present disclosure in its entirety.

FIELD OF THE INVENTION

The present invention relates to a semiconductor light-emitting element.

BACKGROUND OF THE INVENTION

A white light-emitting device including a blue light-emitting element including a nitride semiconductor element as a light-emitting element and a phosphor has recently increasingly been used for a backlight of a large-sized liquid crystal television or a light source for lighting equipment. In such a product as a large-sized liquid crystal television or lighting equipment, many white light-emitting devices are used in one product. Therefore, blue light-emitting elements included in such products are required to be high in quality in mass production.

A nitride semiconductor light-emitting element included in a backlight of a large-sized liquid crystal television or a light source for lighting equipment has increasingly generally been driven in a relatively high-current region, for example, at 80 mA or higher. A conventional nitride semiconductor light-emitting element is driven in a relatively low-current region around 20 mA in many cases.

In some conventional nitride semiconductor light-emitting elements, a nitride semiconductor layer is formed on a C plane of a sapphire substrate and light from a light-emitting layer is extracted not only from the nitride semiconductor layer but also from a side surface of the sapphire substrate. In such a nitride semiconductor light-emitting element, the sapphire substrate should have a thickness large to some extent. In order to prevent light emitted from the side surface of the sapphire substrate from returning to the inside of the sapphire substrate as a result of total reflection by the side surface of the sapphire substrate, the side surface of the sapphire substrate should also be roughened.

For example, Japanese Patent Laying-Open No. 2010-141331 (PTD 1) describes growing a light-emitting structure on a substrate, thereafter forming a division groove like a dotted line in the substrate with laser beams, and thereafter dividing the substrate and the light-emitting structure by applying a pressure to the substrate. Japanese Patent Laying-Open No. 2013-21250 (PTD 2) describes formation of an affected layer in a side surface of a sapphire substrate by emitting laser beams from an upper surface side or a lower surface side of the sapphire substrate.

PTD 1: Japanese Patent Laying-Open No. 2010-141331
PTD 2: Japanese Patent Laying-Open No. 2013-21250

SUMMARY OF THE INVENTION

With the method described in Japanese Patent Laying-Open No. 2010-141331 (PTD 1), however, two or more division grooves are formed in the side surface of the sapphire substrate. In addition, each side surface of the sapphire substrate has the same number of division grooves formed. Therefore, formation of the division grooves is time-consuming Furthermore, formation of the division grooves is costly. This is also the case with the method described in Japanese Patent Laying-Open No. 2013-21250 (PTD 2).

As the number of division grooves formed in a side surface of a sapphire substrate is greater, absorption of some of laser beams (light used for division of the sapphire substrate) by a light-emitting layer at the time of division of the sapphire substrate is more likely. Then, probability of leakage of a current increases. This disadvantage can be avoided by spacing a mesa end surface (a side surface of the light-emitting layer) apart from a chip end surface (a side surface of the sapphire substrate). As the mesa end surface is more distant from the chip end surface, however, a ratio occupied by a light-emitting region in a chip surface is lower, which leads to lowering in light emission output. This is also the case with the method described in Japanese Patent Laying-Open No. 2013-21250 (PTD 2).

The present invention was made in view of such aspects, and an object thereof is to provide a semiconductor light-emitting element which is excellent in light extraction efficiency and can be manufactured inexpensively in a short period of time.

A semiconductor light-emitting element includes a substrate and a semiconductor stack portion provided on the substrate and having at least a first-conductivity-type semiconductor layer, a light-emitting layer, and a second-conductivity-type semiconductor layer. The substrate has a property to allow transmission of light from the light-emitting layer and has a hexahedral shape including a first surface on which the semiconductor stack portion is provided, a second surface located opposite to the first surface, a pair of third surfaces orthogonal to the first surface and the second surface, and a pair of fourth surfaces orthogonal to the first surface and the second surface and different from the pair of third surfaces. The first surface has a projecting and recessed structure having a recess and a projection alternately formed. Each of the third surfaces has a first reformed layer at a position distant by a first distance from the second surface. Each of the fourth surfaces has two or more reformed layers.

Preferably, the recess and the projection are formed in the first surface such that light from the light-emitting layer propagates without being cut off by the projection in a direction in parallel to the third surface while the light is cut off by the projection in a direction in parallel to the fourth surface.

Preferably, the substrate is composed of a material having a crystal structure. The third surface is preferably in parallel to a <1-100> direction of the substrate, and the fourth surface is preferably in parallel to a <11-20> direction of the substrate.

The first reformed layer preferably has a thickness greater than 0 µm, and the two or more reformed layers each preferably have a thickness greater than 0 µm. A portion of the substrate located closer to the first surface than the first reformed layer preferably has a thickness not smaller than 30 µm, and a portion of the substrate located closer to the first surface than the reformed layer located closest to the first surface of the two or more reformed layers preferably has a thickness not smaller than 30 µm.

Preferably, the first reformed layer extends in a direction perpendicular to a direction of thickness of the substrate.

Preferably, the two or more reformed layers each extend in a direction perpendicular to the direction of thickness of the substrate.

According to the present invention, a semiconductor light-emitting element which is excellent in light extraction efficiency and can be manufactured inexpensively in a short period of time can be provided.

DETAILED DESCRIPTION OF THE INVENTION

Figure 1:
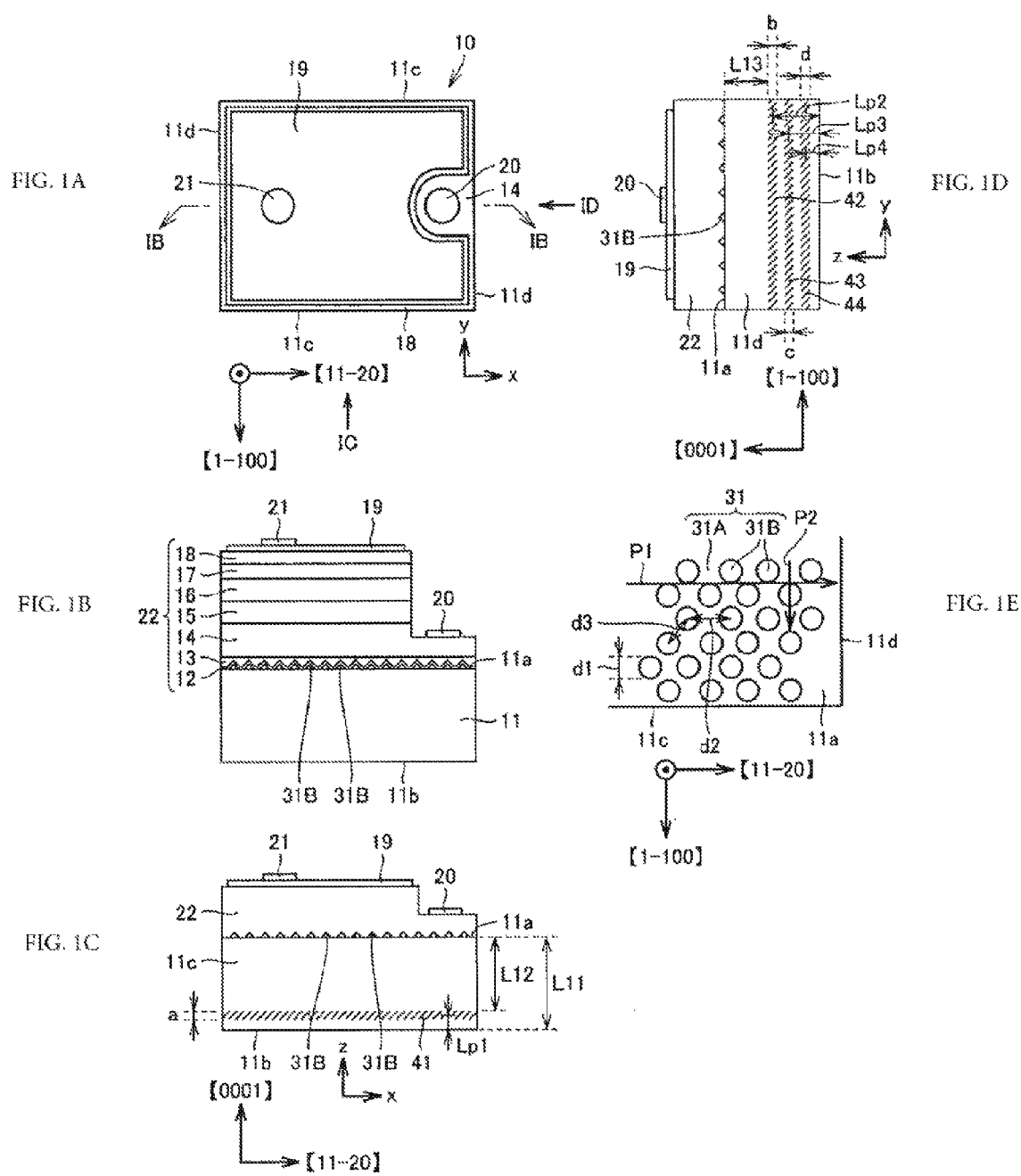
FIG. 1A is a plan view showing one example of a construction of a semiconductor light-emitting element according to the present invention.
FIG. 1B is a cross-sectional view along the line IB-IB shown in FIG. 1A.
FIG. 1C is a side view of a main portion when a semiconductor light-emitting element 10 is viewed in a direction IC shown in FIG. 1A.
FIG. 1D is a side view of the main portion when semiconductor light-emitting element 10 is viewed in a direction ID shown in FIG. 1A.
FIG. 1E is a plan view of a substrate.

A semiconductor light-emitting element according to the present invention will be described hereinafter with reference to the drawings. In the drawings of the present invention, the same or corresponding elements have the same reference characters allotted. Relation of such a dimension as a length, a width, a thickness, or a depth is modified as appropriate for clarity and brevity of the drawings and does not represent actual dimensional relation.

FIG. 1A is a plan view of a semiconductor light-emitting element 10 in a first embodiment. FIG. 1B is a cross-sectional view along the line IB-IB shown in FIG. 1A. FIG. 1C is a side view of a main portion when semiconductor light-emitting element 10 is viewed in a direction IC shown in FIG. 1A, and FIG. 1D is a side view of the main portion when semiconductor light-emitting element 10 is viewed in a direction ID shown in FIG. 1A. FIG. 1E is a plan view of a substrate 11 of semiconductor light-emitting element 10. FIGS. 1C and 1D do not depict a stack structure in a semiconductor stack portion 22 of semiconductor light-emitting element 10.

Semiconductor light-emitting element 10 in the present embodiment includes substrate 11 and semiconductor stack portion 22. Semiconductor stack portion 22 has a buffer layer 12, a non-doped GaN layer 13, an n-type contact layer 14, a multi-layer portion 15, a light-emitting layer 16, a p-type electron blocking layer 17, and a p-type contact layer 18. N-type contact layer 14 corresponds to one of a "first-conductivity-type semiconductor layer" and a "second-conductivity-type semiconductor layer" in claims and p-type contact layer 18 corresponds to the other of the "first-conductivity-type semiconductor layer" and the "second-conductivity-type semiconductor layer" in the claims.

N-type contact layer 14, multi-layer portion 15, light-emitting layer 16, p-type electron blocking layer 17, and p-type contact layer 18 are etched to form a mesa portion. A p-side electrode 21 is provided on p-type contact layer 18 with a transparent electrode 19 being interposed. On an outer side (a right side in FIG. 1B) of the mesa portion, a part of an upper surface of n-type contact layer 14 is exposed through multi-layer portion 15 and the like, and an n-type electrode 20 is provided on an exposed surface of n-type contact layer 14. A portion of the exposed surface of n-type contact layer 14 exposed through n-side electrode 20, an etched end surface of each of n-type contact layer 14, multi-layer portion 15, light-emitting layer 16, p-type electron blocking layer 17, and p-type contact layer 18, and a portion of transparent electrode 19 exposed through p-side electrode 21 may be covered with a surface protection film (not shown). The surface protection film is preferably composed of an insulating material such as silicon oxide, silicon nitride, or titanium oxide. With a surface protection film, resistance to moisture of the semiconductor light-emitting element can be enhanced. In the following, semiconductor stack portion 22, transparent electrode 19, n-side electrode 20, and p-side electrode 21 will be described and then substrate 11 will be described.

Buffer layer 12 is provided on a first surface 11a of substrate 11. Thus, difference in lattice constant between a material forming substrate 11 and a group III nitride semiconductor can be eliminated. Buffer layer 12 is formed preferably from an $Al_{x1}Ga_{y1}O_{z1}N_{1-z1}$ ($0 \leq x1 \leq 1$, $0 \leq y1 \leq 1$, $0 \leq z1 \leq 1$, $x1+y1+z1 \neq 0$) layer and more preferably from an AlN layer or an AlON layer. Buffer layer 12 has a thickness preferably not smaller than 3 nm and not greater than 100 nm and more preferably not smaller than 5 nm and not greater than 50 nm. Buffer layer 12 is formed from an AlN layer having a thickness of 15 nm by way of example.

Non-doped GaN layer 13 is provided on buffer layer 12. With a group III nitride semiconductor layer containing Ga being thus formed on buffer layer 12, dislocation loop is likely around an interface between buffer layer 12 and non-doped GaN layer 13. Therefore, crystal defects in buffer layer 12 can be prevented from being taken over by non-doped GaN layer 13. Non-doped GaN layer 13 has a thickness preferably not smaller than 100 nm and not greater than 3000 nm and has a thickness of 500 nm by way of example.

N-type contact layer 14 is provided on non-doped GaN layer 13. N-type contact layer 14 is preferably a layer obtained by doping an $Al_{x2}Ga_{y2}In_{z2}N$ ($0 \leq x2 \leq 1$, $0 \leq y2 \leq 1$, $0 \leq z2 \leq 1$, $x2+y2+z2 \neq 0$) layer with an n-type dopant. N-type contact layer 14 may be formed from a single layer or may be formed from two or more types of layers different in composition as being stacked. An n-type dopant is preferably at least one of Si and Ge. A concentration of the n-type dopant in n-type contact layer 14 is preferably not lower than $1 \times 10^{18}$ cm$^{-3}$ and not higher than $1 \times 10^{19}$ cm$^{-3}$. N-type contact layer 14 has a thickness preferably not smaller than 1 μm and not greater than 10 μm. Thus, resistance of n-type contact layer 14 can be lowered while cost for manufacturing semiconductor light-emitting element 10 is kept low. N-type contact layer 14 is formed, by way of example, from a GaN layer which is doped with Si by $1 \times 10^{19}$ cm$^{-3}$ and has a thickness of approximately 2 μm.

Multi-layer portion 15 is provided on n-type contact layer 14. Multi-layer portion 15 preferably has, for example, a narrow band gap layer and a wide band gap layer alternately stacked. Multi-layer portion 15 has a thickness preferably not smaller than 60 nm and not greater than 150 nm.

The narrow band gap layer is lower in band gap energy than the wide band gap layer, and it is preferably formed from an $In_{x3}Ga_{1-x3}N$ ($0 < x3 \leq 0.3$) layer. The narrow band gap layer preferably contains an n-type dopant (such as Si). A concentration of the n-type dopant in the narrow band gap layer is preferably not lower than $1 \times 10^{16}$ cm$^{-3}$ and not higher than $5 \times 10^{18}$ cm$^{-3}$ and more preferably not lower than $5 \times 10^{16}$ cm$^{-3}$ and not higher than $5 \times 10^{17}$ cm$^{-3}$. The narrow band gap layer has a thickness preferably not smaller than 1 nm and not greater than 3 nm.

The wide band gap layer is higher in band gap energy than the narrow band gap layer, and it is preferably formed from a GaN layer. The wide band gap layer has a thickness preferably not smaller than 1 nm and not greater than 3 nm.

Multi-layer portion 15 has an $In_{0.02}Ga_{0.98}N$ layer of a thickness of approximately 3.0 nm and a GaN layer of a thickness of approximately 3.0 nm alternately stacked and has 20 sets of the $In_{0.02}Ga_{0.98}N$ layer and the GaN layer by way of example.

Light-emitting layer 16 is provided on multi-layer portion 15. Light-emitting layer 16 may be formed from an $Al_{x4}Ga_{y4}In_{z4}N$ ($0 \leq x4 \leq 1$, $0 \leq y4 \leq 1$, $0 \leq z4 \leq 1$, $x4+y4+z4 \neq 0$) layer or from a layer obtained by doping the $Al_{x4}Ga_{y4}In_{z4}N$ layer with an n-type dopant or a p-type dopant, or may be formed from two or more types of layers different in composition as being stacked. Light-emitting layer 16 has a thickness preferably not smaller than 40 nm and not greater than 80 nm.

In a case that light-emitting layer 16 is formed by alternately stacking a well layer and a barrier layer, the well layer is preferably formed from an $In_{x5}Ga_{1-x5}N$ ($0 \leq x5 \leq 0.3$) layer containing In and the barrier layer is preferably formed from a GaN layer. Light-emitting layer 16 has an $In_{0.2}Ga_{0.8}N$ layer (the well layer) of a thickness of approximately 3.0 nm and a GaN layer (the barrier layer) of a thickness of approximately 4 nm alternately stacked and has 8 sets of the $In_{0.2}Ga_{0.8}N$ layer and the GaN layer by way of example.

P-type electron blocking layer 17 is formed on light-emitting layer 16. Thus, leakage of excessive electrons from light-emitting layer 16 can be prevented. Such a p-type electron blocking layer 17 is preferably formed from a layer obtained by doping an $Al_{x6}Ga_{y6}In_{z6}N$ ($0 \leq x6 \leq 1$, $0 \leq y6 \leq 1$, $0 \leq z6 \leq 1$, $x6+y6+z6 \neq 0$) layer with a p-type dopant. The p-type dopant is preferably at least one of Mg and Zn. A concentration of the p-type dopant in p-type electron blocking layer 17 is preferably not lower than $1 \times 10^{18}$ cm$^{-3}$ and not higher than $2 \times 10^{19}$ cm$^{-3}$. P-type electron blocking layer 17 has a thickness preferably not smaller than 10 nm and not greater than 30 nm. P-type electron blocking layer 17 is formed from a p-type $Al_{0.15}Ga_{0.85}N$ layer doped with Mg by $2 \times 10^{19}$ cm$^{-3}$ and having a thickness of 15 nm by way of example.

P-type contact layer 18 is formed on p-type electron blocking layer 17. P-type contact layer 18 is preferably formed from a layer obtained by doping an $Al_{x7}Ga_{y7}In_{z7}N$ ($0 \leq x7 \leq 1$, $0 \leq y7 \leq 1$, $0 \leq z7 \leq 1$, $x7+y7+z7 \neq 0$) layer with a p-type dopant. P-type contact layer 18 may be formed from a single layer or may be formed from two or more types of layers different in composition as being stacked. A concentration of the p-type dopant in p-type contact layer 18 is preferably not higher than $2 \times 10^{19}$ cm$^{-3}$. P-type contact layer 18 has a thickness preferably not greater than 30 nm.

Though a construction of semiconductor stack portion 22 has been shown above, semiconductor stack portion 22 should only have n-type contact layer 14, light-emitting layer 16, and p-type contact layer 18. Therefore, semiconductor stack portion 22 does not have to have at least one of buffer layer 12, non-doped GaN layer 13, multi-layer portion 15, and p-type electron blocking layer 17, or may further have a semiconductor layer other than buffer layer 12, non-doped GaN layer 13, multi-layer portion 15, and p-type electron blocking layer 17.

Transparent electrode 19 is in ohmic contact with p-type contact layer 18. Transparent electrode 19 may be composed of indium tin oxide (ITO), indium oxide, tin oxide, or zinc oxide, or may be composed of a material containing at least one of Au, Ag, Pt, Ti, Pd, Al, and Ni. Transparent electrode 19 has a thickness preferably not smaller than 20 nm and not greater than 200 nm.

N-side electrode 20 may be formed from a single layer of a metal layer containing at least one of Au, Ag, Pt, Ti, Pd, Al, and Ni, or may be formed from two or more types of metal layers different in material as being stacked. N-side electrode 20 has a thickness preferably not smaller than 1 μm. Thus, wire bonding to n-side electrode 20 can be carried out.

P-side electrode 21 may be formed from a single layer of a metal layer containing at least one of Au, Ag, Pt, Ti, Pd, Al, and Ni, or may be formed from two or more types of metal layers different in material as being stacked. P-side electrode 21 has a thickness preferably not smaller than 1 μm. Thus, wire bonding to p-side electrode 21 can be carried out.

Substrate 11 has a property to allow transmission of light from light-emitting layer 16. "Substrate 11 having a property to allow transmission of light from light-emitting layer 16" means that 50% or more of light from light-emitting layer 16 passes through substrate 11, and preferably 80% or more of light from light-emitting layer 16 passes through substrate 11, and more preferably 90% or more of light from light-emitting layer 16 passes through substrate 11. Substrate 11 is preferably composed of a material having a crystal structure. From the foregoing, substrate 11 is preferably formed from a sapphire substrate or an SiC substrate. Substrate 11 has a hexahedral shape including first surface 11a, a second surface 11b located opposite to first surface 11a, a pair of third surfaces 11c, and a pair of fourth surfaces 11d. The "hexahedral shape" means a prismatic shape having a quadrangle as a bottom surface and includes, for example, a parallelepiped shape or a cubic shape. Substrate 11 is exemplified by a sapphire substrate having a parallelepiped shape having a size of 532 μm×444 μm and a thickness L11 of approximately 130 μm.

First surface 11a is a surface on which semiconductor stack portion 22 is provided and has a projecting and recessed structure 31 having a recess 31A and a projection 31B alternately formed. Recess 31A and projection 31B are formed in first surface 11a such that light from light-emitting layer 16 propagates without being cut off by projection 31B in a direction in parallel to third surface 11c (an x direction) (a path P1) while the light is cut off by projection 31B in a direction perpendicular to third surface 11c (a y direction) (a path P2). For example, in a case that projection 31B is arranged at a position corresponding to a vertex of a triangle on first surface 11a as shown in FIG. 1E, projection 31B on first surface 11a has a diameter d1 preferably not smaller than 1 μm and not greater than 6 μm, a distance between centers (an interval d2) between projections 31B in the direction in parallel to third surface 11c is preferably not smaller than 1.0 μm and not greater than 6.0 μm, and a distance between centers (an interval d3) between projections 31B in a direction in parallel to each side of the triangle is preferably not smaller than 1.0 μm and not greater than 6.0 μm.

In the case shown in FIG. 1E, a quantity of light extracted from fourth surface 11d is greater than a quantity of light extracted from third surface 11c. Therefore, light extraction efficiency can be enhanced by forming two or more reformed layers in each of fourth surfaces 11d. Recess 31A and projection 31B may be formed such that light from light-emitting layer 16 propagates without being cut off by projection 31B in the direction perpendicular to third surface 11c (the y direction) while the light is cut off by projection 31B in the direction in parallel to third surface 11c (the x direction). In that case, a quantity of light extracted from third surface 11c is greater than a quantity of light extracted from fourth surface 11d. Therefore, light extraction efficiency can be enhanced by forming two or more reformed layers in each of third surfaces 11c.

An outer geometry of projection 31B is not limited to a conical shape. When a shape of projection 31B on first surface 11a is different from a circular shape, diameter d1 corresponds to a diameter of a circumscribed circle around a shape of projection 31B on first surface 11a. Arrangement of projections 31B on first surface 11a is not limited to the arrangement described previously.

A pair of third surfaces 11c is orthogonal to first surface 11a and second surface 11b. In a case that substrate 11 is composed of a material having a crystal structure, third surface 11c is preferably in parallel to a <1-100> direction of substrate 11.

Third surface 11c has a first reformed layer 41 at a position distant by a first distance Lp1 from second surface 11b. "First distance Lp1" means a distance between second surface 11b and an intermediate point in a direction of thickness of first reformed layer 41 and it is preferably not smaller than 10 μm and not greater than 50 μm. First distance Lp1 is set to 30 μm by way of example. Here, the direction of thickness of first reformed layer 41 is in parallel to the direction of thickness of substrate 11. "First reformed layer 41" means a layer of which surface has been roughened. Each surface of first reformed layer 41 has arithmetic mean roughness Ra preferably not smaller than 1 μm and not greater than 6 μm.

First reformed layer 41 preferably extends in a direction perpendicular to the direction of thickness of substrate 11 (the x direction). Thus, first reformed layer 41 can be formed more readily than in a case that first reformed layer 41 is provided only in a portion in the direction perpendicular to the direction of thickness of substrate 11. Therefore, a time period required for formation of first reformed layer 41 can be shortened and cost required for formation of first reformed layer 41 can be kept low. A thickness a of first reformed layer 41 is defined as a maximum length of first reformed layer 41 in the direction of thickness of substrate 11 and it is preferably greater than 0 μm and not greater than 50 μm. A portion of substrate 11 located closer to first surface 11a than first reformed layer 41 has a thickness L12 preferably not smaller than 30 μm. Since a distance from first surface 11a of substrate 11 to first reformed layer 41 is thus sufficient, absorption of laser beams emitted during laser scribing (which will be described later) by light-emitting layer 16 and resultant fracture of semiconductor stack portion 22 can be prevented. Since the distance from first surface 11a of substrate 11 to first reformed layer 41 is sufficient, a crack originating from a first reformed portion 141 (see FIG. 4B) can be prevented from reaching semiconductor stack portion 22 during breaking (which will be described later). Therefore, fracture of semiconductor stack portion 22 can be prevented.

The pair of fourth surfaces 11d is a surface orthogonal to first surface 11a and second surface 11b and different from the pair of third surfaces 11c. In a case that substrate 11 is composed of a material having a crystal structure, fourth surface 11d is preferably in parallel to a <11-20> direction of substrate 11. Fourth surface 11d has two or more reformed layers and has second to fourth reformed layers 42 to 44 in the present embodiment.

Each of second reformed layers 42 is preferably provided at a position distant by a second distance Lp2 from second surface 11b. "Second distance Lp2" means a distance between second surface 11b and an intermediate point in a direction of thickness of second reformed layer 42 and it is preferably not smaller than 70 μm and not greater than 90 μm. Second distance Lp2 is set to 80 μm by way of example. Here, the direction of thickness of second reformed layer 42 is in parallel to the direction of thickness of substrate 11. "Second reformed layer 42" means a layer of which surface has been roughened. Each surface of second reformed layer 42 has arithmetic mean roughness Ra preferably not smaller than 1 μm and not greater than 6 μm.

Each of third reformed layers 43 is preferably provided at a position distant by a third distance Lp3 from second surface 11b. "Third distance Lp3" means a distance between second surface 11b and an intermediate point in a direction of thickness of third reformed layer 43 and it is preferably not smaller than 40 μm and not greater than 70 μm. Third distance Lp3 is set to 60 μm by way of example. Here, the direction of thickness of third reformed layer 43 is in parallel to the direction of thickness of substrate 11. "Third reformed layer 43" means a layer of which surface has been roughened. Each surface of third reformed layer 43 has arithmetic mean roughness Ra preferably not smaller than 1 μm and not greater than 6 μm.

Each of fourth reformed layers 44 is preferably provided at a position distant by a fourth distance Lp4 from second surface 11b. "Fourth distance Lp4" means a distance between second surface 11b and an intermediate point in a direction of thickness of fourth reformed layer 44 and it is preferably not smaller than 10 μm and not greater than 50 μm. Fourth distance Lp4 is set to 30 μm by way of example. Here, the direction of thickness of fourth reformed layer 44 is in parallel to the direction of thickness of substrate 11. "Fourth reformed layer 44" means a layer of which surface has been roughened. Each surface of fourth reformed layer 44 has arithmetic mean roughness Ra preferably not smaller than 1 μm and not greater than 6 μm.

Second reformed layer 42 preferably extends in the direction perpendicular to the direction of thickness of substrate 11 (the y direction). Since second reformed layer 42 can thus be formed more readily than in a case that second reformed layer 42 is provided only in a portion in the direction perpendicular to the direction of thickness of substrate 11, a time period required for formation of second reformed layer 42 can be shortened and cost required for formation of second reformed layer 42 can be kept low. This is also the case with each of third reformed layer 43 and fourth reformed layer 44.

A thickness b of second reformed layer 42 is defined as a maximum length of second reformed layer 42 in the direction of thickness of substrate 11 and it is preferably greater than 0 μm and not greater than 50 μm. When thickness b of second reformed layer 42 is greater than 0 μm, a quantity of light extracted from each of fourth surfaces 11d increases. Therefore, light extraction efficiency is further enhanced. This is also the case with each of a thickness c of third reformed layer 43 and a thickness d of fourth reformed layer 44.

A portion of substrate 11 located closer to first surface 11a than second reformed layer 42 (the reformed layer located closest to first surface 11a of the two or more reformed layers) has a thickness L13 preferably not smaller than 30 μm. Since a distance from first surface 11a of substrate 11 to second reformed layer 42 is thus sufficient, absorption of laser beams emitted during laser scribing (which will be described later) by light-emitting layer 16 and resultant fracture of semiconductor stack portion 22 can be prevented. Since the distance from first surface 11a of substrate 11 to second reformed layer 42 is sufficient, a crack originating from a second reformed portion 142 (see FIG. 4C) can be prevented from reaching semiconductor stack portion 22 during breaking (which will be described later). Therefore, fracture of semiconductor stack portion 22 can be prevented.

A method of forming first to fourth reformed layers 41 to 44 is not limited. For example, in manufacturing a semiconductor light-emitting element by dividing a wafer 111 (see FIG. 3 or the like), first to fourth reformed layers 41 to 44 are preferably formed at the time of division of wafer 111. Laser beams of which pulse width is from nanosecond to femtosecond are emitted from a first surface 111a or a second surface 111b of wafer 111 to the inside of wafer 111 such that the laser beams concentrate at a prescribed position in wafer 111. Thus, laser beams of high energy concentrate at the prescribed position in wafer 111 and a reformed portion is formed in a portion in wafer 111 where the laser beams have concentrated. These reformed portions are formed at an interval from each other in a direction perpendicular to the direction of thickness of wafer 111. By breaking wafer 111, cracks included in the reformed portion develop so that wafer 111 is divided into semiconductor light-emitting elements. Accordingly, "a portion formed like layers resulting from connection of reformed portions resulting from development of cracks in the reformed portions (which appeared in a surface layer)" is formed. Namely, first to fourth reformed layers 41 to 44 are formed.

Use of laser beams of which pulse width is from picosecond to femtosecond can allow efficient processing of the inside of substrate 11. An apparatus which produces oscillation of laser beams of which pulse width is of the order of nanosecond is more inexpensive than an apparatus which produces oscillation of laser beams of which pulse width is from picosecond to femtosecond. Therefore, use of laser beams of which pulse width is of the order of nanosecond can achieve lower cost for manufacturing semiconductor light-emitting elements than use of laser beams of which pulse width is from picosecond to femtosecond. A pulse width of laser beams is preferably determined based on such an aspect. Laser beams having a peak wavelength in an infrared region are preferably used.

A larger number of steps of internal processing (reformed portions) can allow smooth division of wafer 111, however, it takes time for processing. For example, in a case that substrate 11 has a thickness L11 of 130 μm, wafer 111 can smoothly be divided and a time period (a cycle time) for processing semiconductor light-emitting element 10 can be prevented from extending when the number of steps is not smaller than 1 and not larger than 3.

Thus, in the present embodiment, two or more reformed layers are provided in each of light extraction surfaces (the pair of fourth surfaces 11d) of side surfaces of substrate 11. Thus, a quantity of light extracted from the side surfaces of substrate 11 is greater than in a case that one reformed layer is provided in each light extraction surface of the side surfaces of substrate 11.

The number of reformed layers provided in each of the side surfaces of substrate 11 (the pair of third surfaces 11c) different from the light extraction surface is smaller than the number of reformed layers provided in each of the light extraction surfaces (the pair of fourth surfaces 11d) of the side surfaces of substrate 11. Thus, as compared with a case that four side surfaces of substrate 11 each have the same number of reformed layers provided, a time period required for formation of reformed layers is shortened and cost required for formation of the reformed layers can be suppressed.

In addition, as compared with the case that the four side surfaces of substrate 11 each have the same number of reformed layers provided, in a side surface smaller in number of reformed layers, laser beams used at the time of division of wafer 111 (for example, laser beams emitted during laser scribing) can be prevented from being absorbed by light-emitting layer 16. Thus, leakage of a current can be prevented. Since it is thus unnecessary to provide a mesa end surface as being spaced apart from a chip end surface, a ratio occupied by a light-emitting region in a chip surface can be maintained high. Therefore, light emission output can be maintained high.

As set forth above, in the present embodiment, semiconductor light-emitting element 10 which is excellent in light extraction efficiency and can be manufactured inexpensively in a short period of time can be provided. This is applicable to all light emission wavelengths of semiconductor light-emitting element 10, without being dependent on a light emission wavelength of semiconductor light-emitting element 10.

Figure 2:
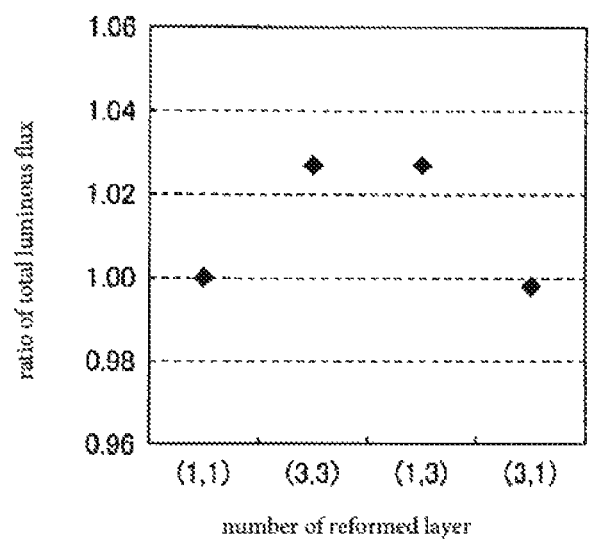
FIG. 2 is a graph showing relation (measurement results) between the number of reformed layers provided in the substrate of the semiconductor light-emitting element and a ratio of total luminous flux of the semiconductor light-emitting element.

FIG. 2 is a graph showing relation (measurement results) between the number of reformed layers provided in the substrate of the semiconductor light-emitting element and a ratio of total luminous flux of the semiconductor light-emitting element. The abscissa in FIG. 2 represents the number of reformed layers. In parentheses, the number of reformed layers provided in each of side surfaces of the substrate (the pair of third surfaces 11c in the present embodiment) which are different from a light extraction surface is shown on the left of a comma, and the number of reformed layers provided in each of light extraction surfaces (the pair of fourth surfaces 11d in the present embodiment) of the side surfaces of the substrate is shown on the right of the comma. The ordinate in FIG. 2 represents a ratio of total luminous flux of semiconductor light-emitting element 10. This ratio of total luminous flux represents a ratio when a quantity of total luminous flux of a semiconductor light-emitting element having the number of reformed layers of (1, 1) is defined as 1.00.

As shown in FIG. 2, a quantity of total luminous flux of semiconductor light-emitting element 10 having the number of reformed layers of (1, 3) is substantially the same as a quantity of total luminous flux of semiconductor light-emitting element 10 having the number of reformed layers of (3, 3), which was greater than a quantity of total luminous flux of semiconductor light-emitting element 10 having the number of reformed layers of (1, 1). On the other hand, a quantity of total luminous flux of a semiconductor light-emitting element having the number of reformed layers of (3, 1) is smaller than the quantity of total luminous flux of semiconductor light-emitting element 10 having the number of reformed layers of (1, 1). It has been found from these results that, when the number of reformed layers in a surface (the pair of fourth surfaces 11$d$ in the present embodiment) perpendicular to a direction in which light from light-emitting layer 16 propagates without being cut off by projection 31B is larger than the number of reformed layers in a surface (the pair of third surfaces 11$c$ in the present embodiment) in parallel to the direction in which light from light-emitting layer 16 propagates without being cut off by projection 31B, the quantity of total luminous flux of semiconductor light-emitting element 10 is greater.

Figure 3:
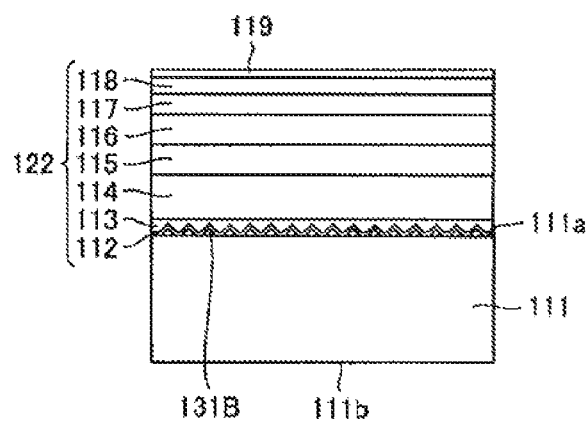
FIG. 3 is a cross-sectional view showing one step in a method of manufacturing a semiconductor light-emitting element.
Figure 4A:
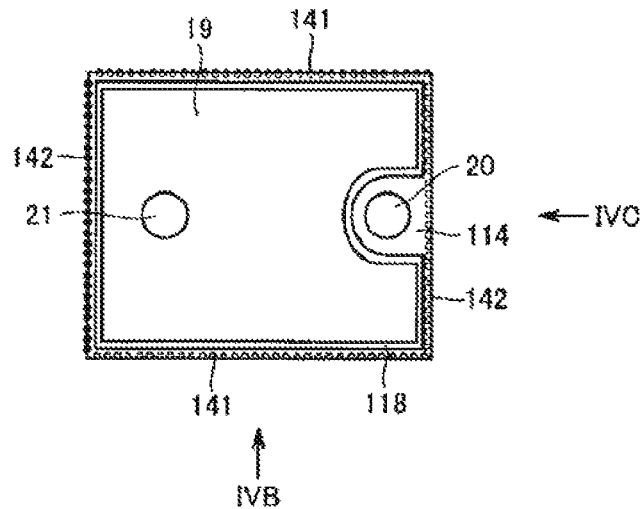
FIG. 4A is an enlarged view of a main portion showing one step in the method of manufacturing a semiconductor light-emitting element.
Figure 4B:
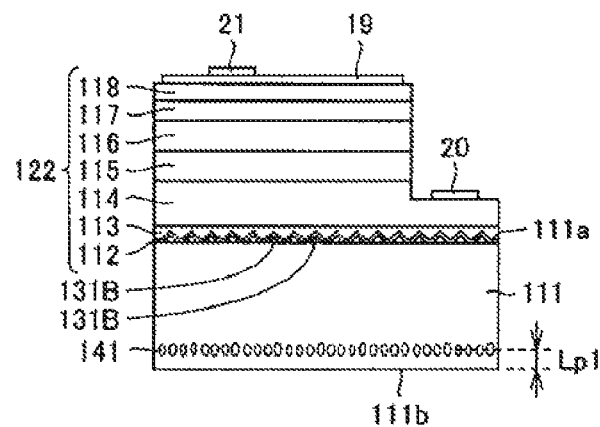
FIG. 4B is a side view of the main portion when a wafer is viewed in a direction IVB shown in FIG. 4A.
Figure 4C:
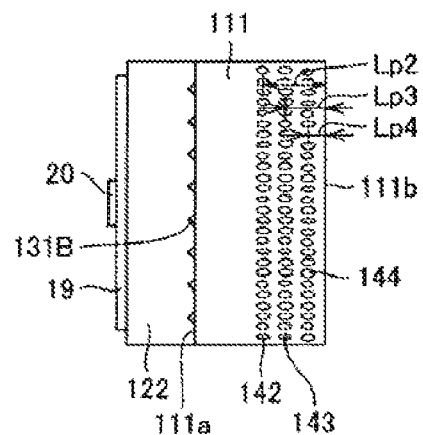
FIG. 4C is a side view of the main portion when the wafer is viewed in a direction IVC shown in FIG. 4A.

FIG. 3 is a cross-sectional view showing one step of a method of manufacturing semiconductor light-emitting element 10. FIG. 4A is an enlarged view of a main portion showing one step in the method of manufacturing semiconductor light-emitting element 10, FIG. 4B is a side view of the main portion when wafer 111 is viewed in a direction IVB shown in FIG. 4A, and FIG. 4C is a side view of the main portion when wafer 111 is viewed in a direction IVC shown in FIG. 4A. Though wafer 111 has two or more semiconductor light-emitting element regions, FIGS. 3 and 4A to 4C depict only one semiconductor light-emitting element region. FIG. 4C does not depict a stack structure in a semiconductor stack portion 122 of wafer 111.

Wafer 111 is initially prepared. A resist is patterned on first surface 111$a$ of wafer 111, and a portion of wafer 111 exposed through the resist is etched, for example, with inductively coupled plasma (ICP). Thus, a projecting and recessed structure having a recess and a projection 131B alternately formed is formed on first surface 111$a$ of wafer 111.

Then, for example, with metal organic chemical vapor deposition (MOCVD), a buffer layer 112, a non-doped GaN layer 113, an n-type contact layer 114, a multi-layer portion 115, a light-emitting layer 116, a p-type electron blocking layer 117, and a p-type contact layer 118 are successively formed on first surface 111$a$ of wafer 111. Semiconductor stack portion 122 is thus formed on first surface 111$a$ of wafer 111. Thereafter, this wafer 111 is subjected to heat treatment, to thereby activate a p-type dopant.

In succession, transparent electrode 19 is formed. For example, with sputtering or vacuum vapor deposition, a transparent electrode 119 is formed on p-type contact layer 118 (FIG. 3). After a mask (not shown) is formed on that transparent electrode 119, a portion of transparent electrode 119 exposed through the mask is removed with the use, for example, of hydrogen fluoride (wet etching).

In succession, a mesa structure is formed. A mask (not shown) is formed on transparent electrode 19. This mask covers transparent electrode 19 and its surroundings, and it has an opening at a position where n-side electrode 20 is to be provided. Thereafter, a portion of p-type contact layer 118, p-type electron blocking layer 117, light-emitting layer 116, multi-layer portion 115, and n-type contact layer 114 which is exposed through the mask is removed through dry etching. Thus, a part of n-type contact layer 114 is exposed, and semiconductor stack portions 122 are disposed in lattices on first surface 111$a$ of wafer 111.

In succession, n-side electrode 20 and p-side electrode 21 are provided. A mask having an opening formed at a position where n-side electrode 20 is to be provided is formed on an exposed surface of n-type contact layer 114. In the opening of that mask, n-side electrode 20 is formed, for example, with vacuum vapor deposition or sputtering. A mask having an opening formed at a position where p-side electrode 21 is to be provided is formed on transparent electrode 19. In the opening of that mask, p-side electrode 21 is formed, for example, with vacuum vapor deposition or sputtering. The order of formation of n-side electrode 20 and p-side electrode 21 does not particularly matter. Thereafter, a surface protection film is formed as necessary.

In succession, the obtained wafer is divided. For example, a wafer is bonded to an adhesive sheet bonded to a stainless ring, and the stainless ring is set onto a stage of a laser scribing apparatus. Laser beams are concentrated at a position distant by first distance Lp1 from second surface 111$b$, in a portion which will be a long side forming second surface 11$b$ of substrate 11 (laser scribing). Thus, in a portion where laser beams were concentrated, first reformed portions 141 are formed, for example, at an interval approximately from 3 to 5 μm. Thereafter, after the wafer is turned 90°, laser beams are concentrated at a position distant by second distance Lp2 from second surface 111$b$, at a position distant by third distance Lp3 from second surface 111$b$, and at a position distant by fourth distance Lp4 from second surface 111$b$, in a portion which will be a short side forming second surface 11$b$ of substrate 11 (laser scribing). Thus, in portions where laser beams were concentrated, second to fourth reformed portions 142, 143, and 144 are formed. At a position distant by second distance Lp2 from second surface 111$b$, second reformed portions 142 are formed, for example, at an interval approximately from 3 to 5 μm. At a position distant by third distance Lp3 from second surface 111$b$, third reformed portions 143 are formed, for example, at an interval approximately from 3 to 5 μm. At a position distant by fourth distance Lp4 from second surface 111$b$, fourth reformed portions 144 are formed, for example, at an interval approximately from 3 to 5 μm. Such laser scribing is preferably performed repeatedly with wafer 111 being moved by a distance comparable to a size of a chip. Thereafter, wafer 111 is removed from the stainless ring and subjected to breaking. Thus, a crack originates from each of first reformed portion 141, second reformed portion 142, third reformed portion 143, and fourth reformed portion 144 and the cracks develop in the direction of thickness of wafer 111, so that wafer 111 is divided. Simultaneously, first reformed portions 141 are connected to each other to thereby form first reformed layer 41, second reformed portions 142 are connected to each other to thereby form second reformed layer 42, third reformed portions 143 are connected to each other to thereby form third reformed layer 43, and fourth reformed portions 144 are connected to each other to thereby form fourth reformed layer 44. Semiconductor light-emitting element 10 is thus obtained.

The present inventors have confirmed that, even when semiconductor light-emitting element 10 is sealed with a resin, semiconductor light-emitting element 10 which is excellent in light extraction efficiency and can be manufactured inexpensively in a short period of time can be provided. A resin used for sealing semiconductor light-emitting element 10 preferably has a property to allow transmission of light from light-emitting layer 16. The resin more preferably contains a fluorescent material emitting fluorescence as it absorbs light from light-emitting layer 16.

Figure 5:
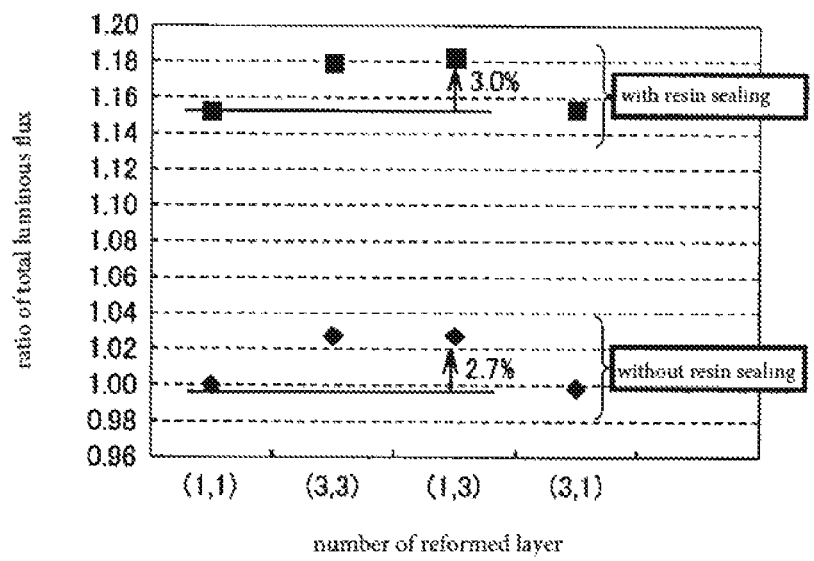
FIG. 5 is a graph showing relation (measurement results) between the number of reformed layers provided in the substrate of the semiconductor light-emitting element and a ratio of total luminous flux of the semiconductor light-emitting element.

FIG. 5 is a graph showing relation (measurement results) between the number of reformed layers provided in the substrate of the semiconductor light-emitting element and a ratio of total luminous flux of the semiconductor light-emitting element. FIG. 5 shows results in a case that a semiconductor light-emitting element is sealed with a resin (with resin sealing) and results in a case that a semiconductor light-emitting element is not sealed with a resin (without resin sealing, corresponding to the results shown in FIG. 2). The abscissa in FIG. 5 represents the number of reformed layers. In parentheses, the number of reformed layers provided in each of side surfaces of the substrate (the pair of third surfaces 11*c*) which are different from a light extraction surface is shown on the left of a comma, and the number of reformed layers provided in each of light extraction surfaces (the pair of fourth surfaces 11*d*) of the side surfaces of the substrate is shown on the right of the comma. The ordinate in FIG. 5 represents a ratio of total luminous flux of the semiconductor light-emitting element. This ratio of total luminous flux represents a ratio when a quantity of total luminous flux of a semiconductor light-emitting element having the number of reformed layers of (1, 1) which is not sealed with a resin is defined as 1.00.

As shown in FIG. 5, when semiconductor light-emitting element 10 is sealed with a resin as well, results the same as the results shown in FIG. 2 are obtained. When semiconductor light-emitting element 10 is sealed with a resin, a quantity of luminous flux has increased as compared with a case that semiconductor light-emitting element 10 is not sealed with a resin.

Figure 6:
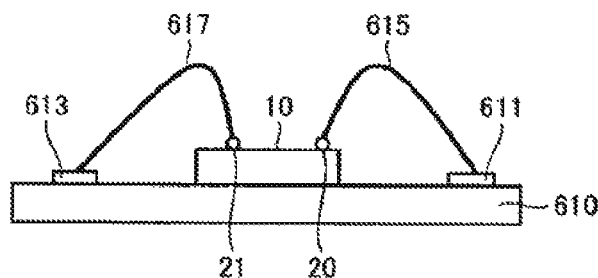
FIG. 6 is a side view showing one example of a form of use of the semiconductor light-emitting element.

FIG. 6 is a side view showing one example of a form of use of semiconductor light-emitting element 10. Semiconductor light-emitting element 10 is simplified in FIG. 6, which is also the case with FIGS. 7 and 8. Semiconductor light-emitting element 10 is provided on a ceramic substrate 610. Ceramic substrate 610 has a first electrode 611 and a second electrode 613, first electrode 611 is connected to n-side electrode 20 of semiconductor light-emitting element 10 through a conductive wire 615, and second electrode 613 is connected to p-side electrode 21 of semiconductor light-emitting element 10 through a conductive wire 617.

Figure 7:
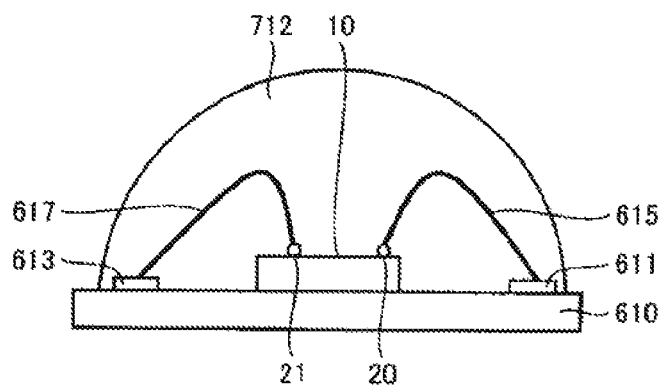
FIG. 7 is a side view showing one example of a form of use of the semiconductor light-emitting element.

FIG. 7 is a side view showing one example of a form of use of semiconductor light-emitting element 10. Though semiconductor light-emitting element 10 is provided on ceramic substrate 610 as in the case shown in FIG. 6, it is sealed with a transparent resin 712. Transparent resin 712 preferably contains a fluorescent material described previously. Thus, light from light-emitting layer 16 and light from the fluorescent material are mixed so that, for example, white light is emitted. This is also the case with a transparent resin 811 (see FIG. 8A) which will be described later and a transparent resin 911 (see FIG. 9A) which will be described later.

Figure 8A:
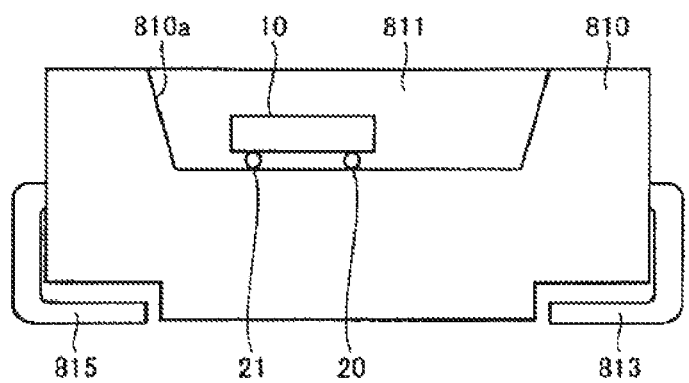
FIG. 8A and FIG. 8B are each a side view showing one example of a form of use of the semiconductor light-emitting element.

FIG. 8A is a side view showing one example of a form of use of semiconductor light-emitting element 10. Semiconductor light-emitting element 10 is provided on a bottom surface of a recess 810*a* of a package 810, and recess 810*a* is filled with transparent resin 811. Semiconductor light-emitting element 10 is thus sealed with transparent resin 811. Package 810 means a substrate for use in lighting equipment or a backlight, on which semiconductor light-emitting element 10 is to be mounted, and it has an n-side electrode 813 and a p-side electrode 815 which are electrodes for external connection.

Figure 8B:
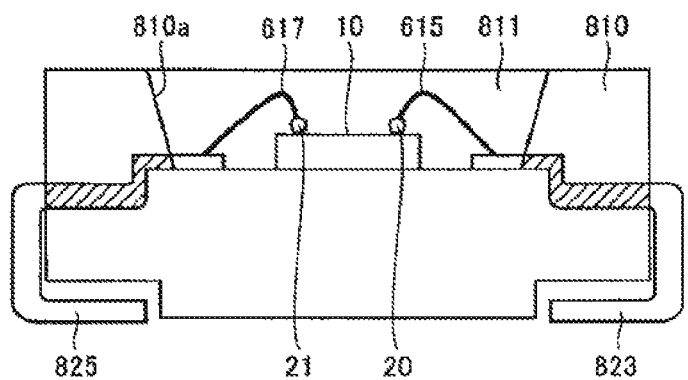

FIG. 8B is a side view showing one example of a form of use of semiconductor light-emitting element 10. In FIG. 8B, semiconductor light-emitting element 10 is provided on the bottom surface of recess 810*a* of package 810 with n-side electrode 20 and p-side electrode 21 facing upward. N-side electrode 20 is connected to an n-side electrode 823 of package 810 through conductive wire 615, and p-side electrode 21 is connected to a p-side electrode 825 of package 810 through conductive wire 617.

Figure 9A:
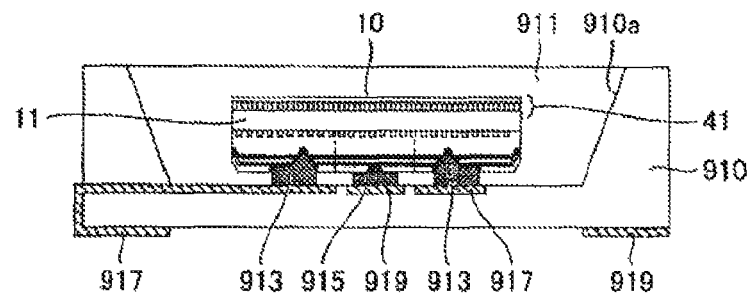
FIG. 9A is a cross-sectional view showing one example of a form of use of the semiconductor light-emitting element.
Figure 9B:
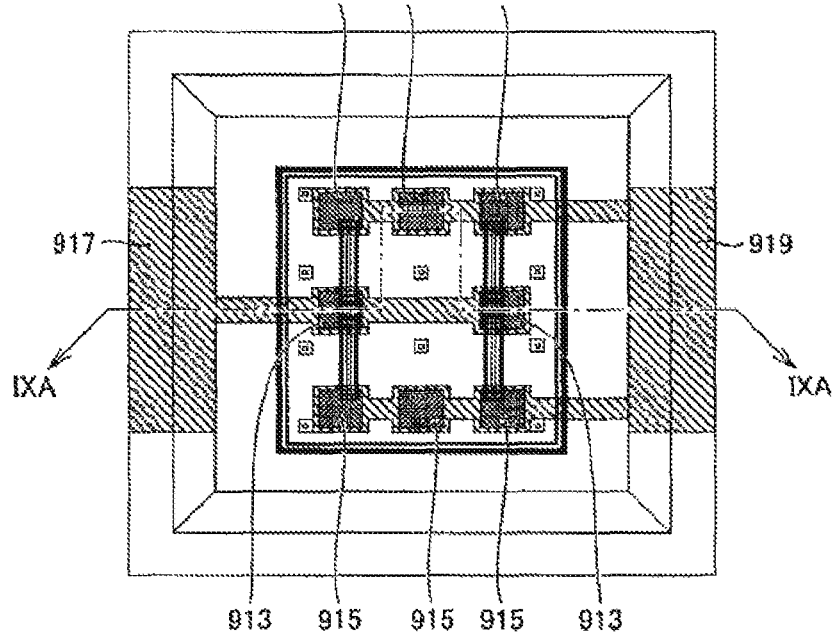
FIG. 9B is a top view thereof.
Figure 9C:
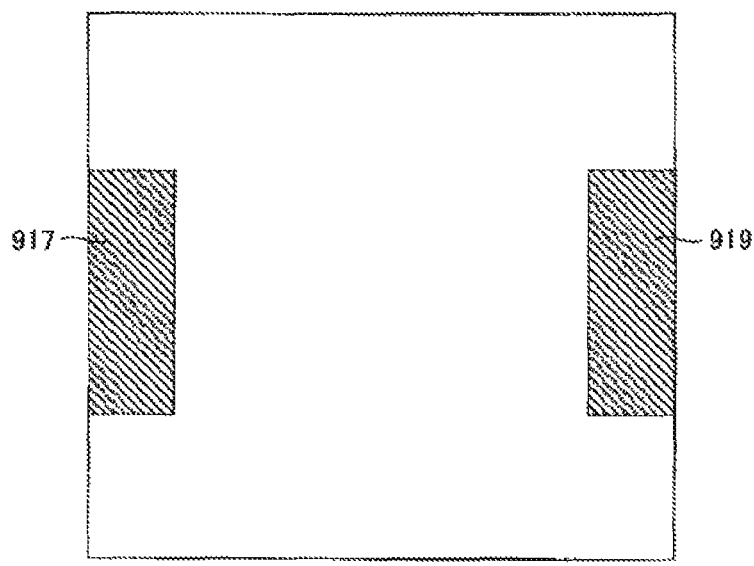
FIG. 9C is a bottom view thereof.

FIG. 9A is a cross-sectional view showing one example of a form of use of semiconductor light-emitting element 10, which is a cross-sectional view along the line IXA-IXA shown in FIG. 9B. FIG. 9B is a top view thereof and FIG. 9C is a bottom view thereof. Semiconductor light-emitting element 10 is flip-chip mounted on a package 910. Specifically, package 910 has an n-side electrode 917 and a p-side electrode 919 which are electrodes for external connection. A part of each of n-side electrode 917 and p-side electrode 919 is provided on a lower surface of package 910, and a remaining part thereof is provided on a bottom surface of a recess 910*a* of package 910. In recess 910*a* of package 910, an n-side junction electrode 913 is provided on n-side electrode 917, and a p-side junction electrode 915 is provided on p-side electrode 919. N-side electrode 20 of semiconductor light-emitting element 10 is connected to n-side electrode 917 through n-side junction electrode 913, and p-side electrode 21 thereof is connected to p-side electrode 919 through p-side junction electrode 915. Recess 910*a* of package 910 is filled with transparent resin 911, so that semiconductor light-emitting element 10 is sealed with transparent resin 911.

A construction of package 910 is not particularly limited. For example, package 910 may be such a bath tub as having an indentation in a shape like a flat plate, or an elongated rod, or a recess, a recessed side surface functioning as a reflector.

A sub mount may be provided between semiconductor light-emitting element 10 and package 910. Then, mounting of semiconductor light-emitting element 10 is facilitated, heat radiation characteristics of semiconductor light-emitting element 10 are improved, and light emission output from semiconductor light-emitting element 10 is improved.

As described above, semiconductor light-emitting element 10 shown in FIG. 1 includes substrate 11 and semiconductor stack portion 22 provided on substrate 11 and having at least first-conductivity-type semiconductor layer 14, light-emitting layer 16, and second-conductivity-type semiconductor layer 18. Substrate 11 has a property to allow transmission of light from light-emitting layer 16 and has a hexahedral shape including first surface 11*a* on which semiconductor stack portion 22 is provided, second surface 11*b* located opposite to first surface 11*a*, a pair of third surfaces 11*c* orthogonal to first surface 11*a* and second surface 11*b*, and a pair of fourth surfaces 11*d* orthogonal to first surface 11*a* and second surface 11*b* and different from the pair of third surfaces 11*c*. First surface 11*a* has projecting and recessed structure 31 having recess 31A and projection 31B alternately formed. Each of third surfaces 11*c* has first reformed layer 41 at a position distant by first distance Lp1 from second surface 11*b*. Each of fourth surfaces 11*d* has two or more reformed layers. Thus, semiconductor light-emitting element 10 which is excellent in light extraction efficiency and can be manufactured inexpensively in a short period of time can be provided.

Preferably, recess 31A and projection 31B are formed in first surface 11a such that light from light-emitting layer 16 propagates without being cut off by projection 31B in the direction in parallel to third surface 11c while the light is cut off by projection 31B in the direction in parallel to fourth surface 11d. Thus, light from light-emitting layer 16 is extracted also from fourth surface 11d. Therefore, light extraction efficiency is further improved.

Preferably, substrate 11 is composed of a material having a crystal structure. Third surface 11c is preferably in parallel to the <1-100> direction of substrate 11, and fourth surface 11d is preferably in parallel to the <11-20> direction of substrate 11.

Preferably, first reformed layer 41 has a thickness greater than 0 μm, and preferably, the two or more reformed layers each have a thickness greater than 0 μm. Preferably, a portion of substrate 11 located closer to first surface 11a than first reformed layer 41 has a thickness not smaller than 30 μm, and preferably, a portion of substrate 11 located closer to first surface 11a than the reformed layer located closest to first surface 11a of the two or more reformed layers has a thickness not smaller than 30 μm. Thus, light extraction efficiency is further improved.

Preferably, first reformed layer 41 extends in the direction perpendicular to the direction of thickness of substrate 11. Preferably, the two or more reformed layers each extend in the direction perpendicular to the direction of thickness of substrate 11. Thus, a time period required for formation of first reformed layer 41 and the two or more reformed layers is further shortened.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 10 semiconductor light-emitting element; 11 substrate; 11a, 111a first surface; 11b, 111b second surface; 11c third surface; 11d fourth surface; 12, 112 buffer layer; 13, 113 non-doped GaN layer; 14, 114 n-type contact layer; 15, 115 multi-layer portion; 16, 116 light-emitting layer; 17, 117 p-type electron blocking layer; 18, 118 p-type contact layer; 19, 119 transparent electrode; 20 n-side electrode; 21 p-side electrode; 22, 122 semiconductor stack portion; 31 projecting and recessed structure; 31A recess; 31B, 131B projection; 41 first reformed layer; 42 second reformed layer; 43 third reformed layer; and 44 fourth reformed layer.

The invention claimed is:

1. A semiconductor light-emitting element, comprising:
a substrate; and
a semiconductor stack portion provided on said substrate and having at least a first-conductivity-type semiconductor layer, a light-emitting layer, and a second-conductivity-type semiconductor layer,
said substrate having
a property to allow transmission of light from said light-emitting layer, and
a hexahedral shape including a first surface on which said semiconductor stack portion is provided, a second surface located opposite to said first surface, a pair of third surfaces orthogonal to said first surface and said second surface, and a pair of fourth surfaces orthogonal to said first surface and said second surface and different from said pair of third surfaces,
said first surface having a projecting and recessed structure having a recess and a projection alternately formed,
each of said third surfaces having a first reformed layer at a position distant by a first distance from said second surface,
each of said fourth surfaces having two or more reformed layers,
said two or more reformed layers having a second reformed layer,
said second reformed layer being provided at a position distant by a second distance from said second surface, and
a number of said first reformed layers provided in each of said third surface being smaller than a number of said two or more reformed layers provided in each of said fourth surface.

2. The semiconductor light-emitting element according to claim 1, wherein
said hexahedral shape includes a parallelepiped shape.

3. The semiconductor light-emitting element according to claim 1, wherein
said hexahedral shape includes a parallelepiped shape, and
said first surface and said second surface of said substrate are formed from a pair of long sides and a pair of short sides.

4. The semiconductor light-emitting element according to claim 3, wherein
said third surfaces are formed on a side of said long sides, and
said fourth surfaces are formed on a side of said short sides.

5. The semiconductor light-emitting element according to claim 1, wherein
said first reformed layer is provided at a position apart from said first surface.

6. The semiconductor light-emitting element according to claim 5, wherein
a portion of substrate located closer to said first surface than said first reformed layer has a thickness not smaller than 30 μm.

7. The semiconductor light-emitting element according to claim 1, wherein
said second reformed layer are formed as a reformed layer located closest to said first surface of said two or more reformed layers, and
said second reformed layer is provided at a position apart from said first surface.

8. The semiconductor light-emitting element according to claim 7, wherein
a portion of substrate located closer to said first surface than said second reformed layer has a thickness not smaller than 30 μm.

9. The semiconductor light-emitting element according to claim 1, wherein
said substrate is composed of a material having a crystal structure,
said third surface is in parallel to a <1-100> direction of said substrate, and
said fourth surface is in parallel to a <11-20> direction of said substrate.

10. The semiconductor light-emitting element according to claim 1, wherein
said first reformed layer extends in a direction perpendicular to a direction of thickness of said substrate, and said two or more reformed layers each extend in a direction perpendicular to the direction of thickness of said substrate.

11. The semiconductor light-emitting element according to claim 1, wherein
said first reformed layer and said two or more reformed layers are portions formed like layers resulting from connection of reformed portions resulting from development of cracks in the reformed portions which appeared in a surface layer by breaking a wafer.

12. The semiconductor light-emitting element according to claim 11, wherein
said reformed portions are formed at an interval from each other in a direction perpendicular to the direction of thickness of said wafer.

* * * * *